(12) United States Patent
Taylor et al.

(10) Patent No.: US 8,929,163 B2
(45) Date of Patent: Jan. 6, 2015

(54) INPUT BUFFER APPARATUSES AND METHODS

(71) Applicant: Micron Technology, Inc., Boise, ID (US)

(72) Inventors: Jennifer Taylor, Boise, ID (US); Dragos Dimitriu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/839,996

(22) Filed: Mar. 15, 2013

(65) Prior Publication Data

US 2014/0269118 A1    Sep. 18, 2014

(51) Int. Cl.
*G11C 7/00* (2006.01)
*G11C 7/10* (2006.01)
*H03F 3/45* (2006.01)

(52) U.S. Cl.
CPC .......... *G11C 7/1084* (2013.01); *H03F 3/45179* (2013.01)
USPC ...................................... 365/193; 365/189.16

(58) Field of Classification Search
CPC .................... H04F 1/3211; H04F 2203/45511; H04N 5/20; G11C 16/04; G11C 7/1078; G11C 7/1084
See application file for complete search history.

(56) References Cited

U.S. PATENT DOCUMENTS

| | | | |
|---|---|---|---|
| 6,605,997 B1 * | 8/2003 | Hanson et al. | 330/253 |
| 7,557,651 B2 * | 7/2009 | Corsi | 330/69 |
| 7,622,986 B2 * | 11/2009 | Pan et al. | 327/563 |
| 2009/0289716 A1 * | 11/2009 | Jaeger et al. | 330/261 |
| 2012/0014156 A1 * | 1/2012 | Park et al. | 365/51 |
| 2012/0320691 A1 * | 12/2012 | Dally et al. | 365/189.15 |

OTHER PUBLICATIONS

Tony Chan Carusone; David A. Johns; Kenneth W. Martin, Analog Integrated Circuit Design, 2nd Edition, Dec. 13, 2011, John Wiley & Sons, 2nd Edition, Chapter 6, Fig. 6.1, Eq. 6.51.*

* cited by examiner

*Primary Examiner* — Michael Tran
(74) *Attorney, Agent, or Firm* — Schwegman Lundberg & Woessner, P.A.

(57) ABSTRACT

Apparatuses and methods are disclosed, including an apparatus with a first differential amplifier to amplify an input signal into a first output signal, a second differential amplifier to amplify the input signal into a second output signal that is complementary to the first output signal, and a feedback resistance coupled between the first output signal and the second output signal. Additional apparatuses and methods are described.

22 Claims, 5 Drawing Sheets

INPUT BUFFER APPARATUSES AND METHODS

BACKGROUND

Integrated circuit devices can have input buffers to convert analog data input signals into full-rail complementary metal-oxide-semiconductor (CMOS) signals. For single-ended input signals, the transition from a logic 'high' to a logic 'low' is dependent on when the input signal crosses a reference voltage. A differential amplifier may detect the transition of the input signal across the reference voltage.

A metal-oxide-semiconductor (MOS)-based self-biased differential amplifier can convert input signal swings of less than 100 millivolts to full-rail signals. However, as the frequency of the input signal approaches 1 GHz, the gain of the MOS-based self-biased differential amplifier can roll off. This loss in gain can compromise the capacity of the MOS-based self-biased differential amplifier to convert the input signal into a full-rail output signal.

Current Mode Logic (CML) input buffers can be used for an input-output (I/O) interface. CML input buffers achieve increased speeds by limiting a swing of an output signal. However, CML input buffers require external biasing, which comes at the cost of substantial layout area and power requirements. Further, CML bias currents can be several times higher than a bias current for a MOS-based self-biased differential amplifier.

BRIEF DESCRIPTION OF THE DRAWINGS

Some embodiments are illustrated by way of example and not limitation in the figures of the accompanying drawings in which.

DETAILED DESCRIPTION

For the purposes of this document, an "apparatus" can refer to any of a number of structures, such as circuitry, a device or a system. In this description, a transistor is described as being switched on to assume an activated state when it is rendered conductive by a control gate voltage. The transistor is described as being switched off to assume an inactive state when it is rendered non-conductive by a control gate voltage. Potentials refer to electrical potentials.

Figure 1:
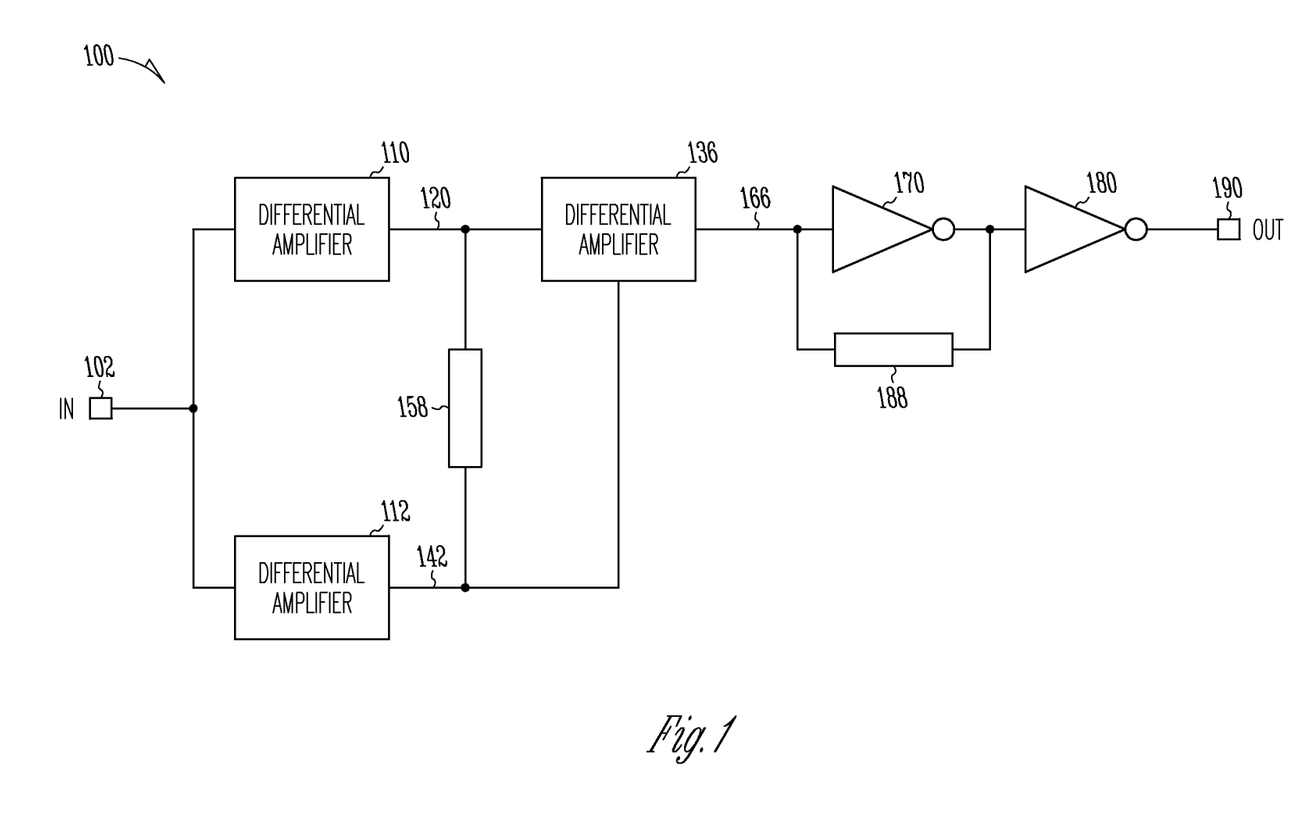
FIG. 1 is a block diagram of an apparatus in the form of an input buffer system according to various embodiments.

The challenges noted above, as well as others, can be addressed by an apparatus shown in FIG. 1. FIG. 1 is a block diagram of an apparatus in the form of an input buffer system 100 according to various embodiments. An input signal IN is received at an input terminal 102 coupled to inputs of a first differential amplifier 110 and a second differential amplifier 112. The first differential amplifier 110 amplifies the input signal IN to generate a first output signal on a first output line 120 that is coupled to a first input of a third differential amplifier 136. The second differential amplifier 112 amplifies the input signal IN to generate a second output signal on a second output line 142 coupled to a second input of the third differential amplifier 136. A first feedback resistor 158 is coupled between the first output line 120 and the second output line 142 and can limit a voltage swing between the first output line 120 and the second output line 142.

The third differential amplifier 136 amplifies the first output signal and the second output signal to generate a third output signal on a third output line 166 coupled to an input of a first inverter 170. An output of the first inverter 170 is coupled to an input of a second inverter 180. A second feedback resistor 188 is coupled between the third output line 166 and the output of the first inverter 170 to provide feedback between the output and the input of the first inverter 170. The third output signal is inverted by the first inverter 170 and the second inverter 180 to generate an output signal OUT on an output terminal 190.

The first differential amplifier 110, the second differential amplifier 112 and the third differential amplifier 136 can be metal oxide semiconductor (MOS)-based self-biased differential amplifiers according to various embodiments.

Figure 2:
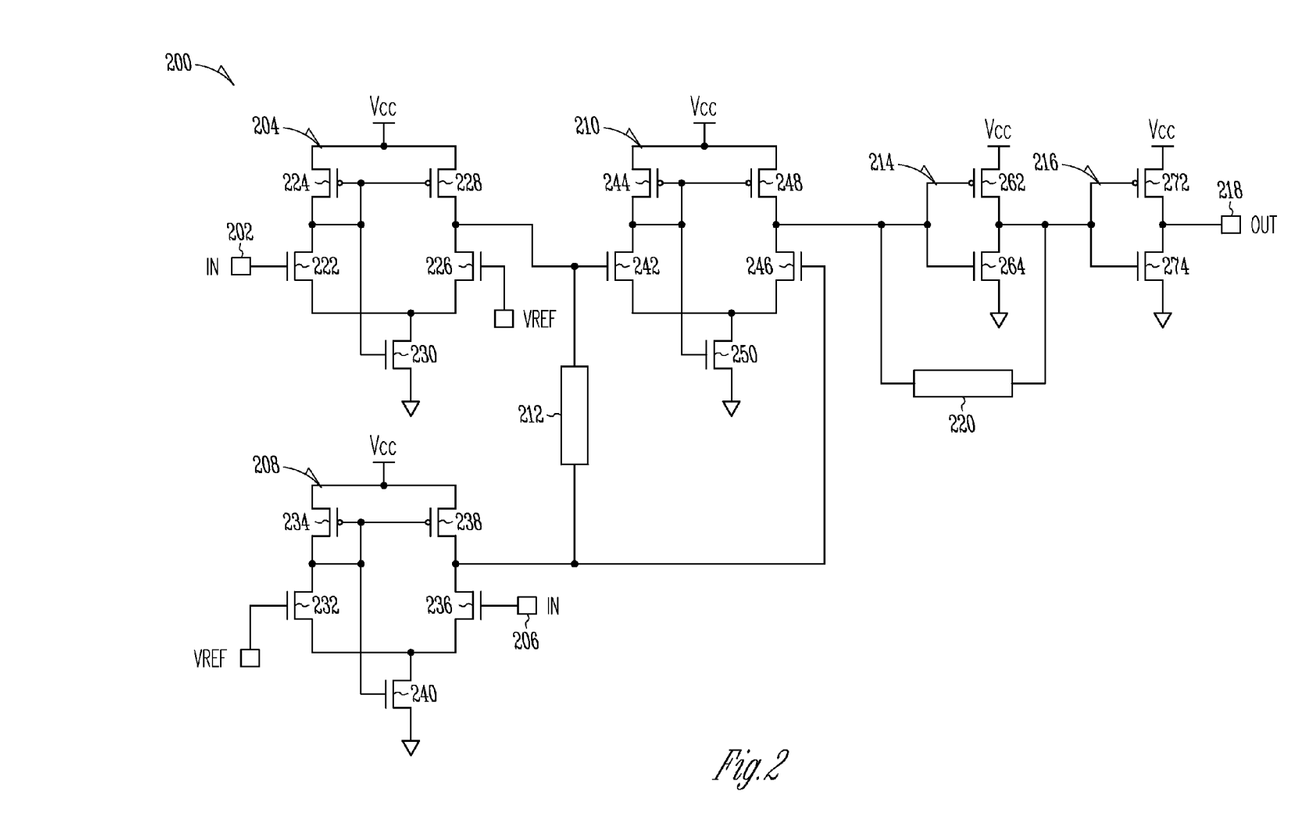
FIG. 2 is an electrical schematic diagram of an apparatus in the form of an input buffer system according to various embodiments.

FIG. 2 is an electrical schematic diagram of an apparatus in the form of an input buffer system 200 according to various embodiments. An input signal IN is received at an input terminal 202 of a first differential amplifier 204 and at an input terminal 206 of a second differential amplifier 208. The first and second differential amplifiers 204 and 208 amplify the input signal IN to generate intermediate signals that are combined and amplified by a third differential amplifier 210 into an output signal OUT. A first feedback resistor 212 is coupled between the first and second differential amplifiers 204 and 208 and can limit a voltage swing between the first and second differential amplifiers 204 and 208. The output signal OUT is amplified and inverted by a first inverter 214 and a second inverter 216 and then provided to an output terminal 218. Additional feedback is provided by a second feedback resistor 220 coupled in parallel with the first inverter 214.

The first differential amplifier 204 includes an N-channel transistor 222 having a drain coupled to a drain of a P-channel transistor 224 and a gate coupled to the input terminal 202 to receive the input signal IN. The gate of the N-channel transistor 222 is a non-inverting input of the first differential amplifier 204. An N-channel transistor 226 has a drain coupled to a drain of a P-channel transistor 228 and a gate coupled to receive a reference voltage VREF. The gate of the N-channel transistor 226 is an inverting input of the first differential amplifier 204. An output signal from the first differential amplifier 204 is generated at the drain of the N-channel transistor 226. Sources of the P-channel transistors 224 and 228 are coupled to a positive voltage supply Vcc which can be from 1 volt to 1.7 volts. The P-channel transistors 224 and 228 are a load network to modulate a voltage swing of the first differential amplifier 204. Sources of the N-channel transistors 222 and 226 are coupled to a drain of an N-channel transistor 230, and a source of the N-channel transistor 230 is coupled to a reference voltage (e.g., ground voltage). A gate of the N-channel transistor 230 is coupled to gates of the P-channel transistors 224 and 228 and to the drain of the N-channel transistor 222 to self-bias the first differential amplifier 204.

The second differential amplifier 208 and the third differential amplifier 210 are similar to the first differential amplifier 204. The second differential amplifier 208 includes an N-channel transistor 232 having a drain coupled to a drain of a P-channel transistor 234 and a gate coupled to receive the reference voltage VREF. The gate of the N-channel transistor 232 is a non-inverting input of the second differential amplifier 208. An N-channel transistor 236 has a drain coupled to a drain of a P-channel transistor 238 and a gate coupled to the input terminal 206 to receive the input signal IN. The gate of the N-channel transistor 236 is an inverting input of the second differential amplifier 208. An output signal from the second differential amplifier 208 is generated at the drain of the N-channel transistor 236. Sources of the P-channel transistors 234 and 238 are coupled to the positive voltage supply Vcc. The P-channel transistors 234 and 238 are a load network to modulate a voltage swing of the second differential amplifier 208. Sources of the N-channel transistors 232 and 236 are coupled to a drain of an N-channel transistor 240, and a source of the N-channel transistor 240 is coupled to a reference voltage (e.g., ground voltage). A gate of the N-channel transistor 240 is coupled to gates of the P-channel transistors 234 and 238 and to the drain of the N-channel transistor 232 to self-bias the second differential amplifier 208.

The reference voltage VREF may be selected to be at the midpoint of the swing of the input signal IN to indicate a transition of the input signal IN from a logic 'high' to a logic 'low'. The output signals of the first and second differential amplifiers 204 and 208 are out of phase with each other because the input signal IN is coupled to the non-inverting input of the first differential amplifier 204 and to the inverting input of the second differential amplifier 208. The output signals of the first and second differential amplifiers 204 and 208 may be amplified as a differential signal by the third differential amplifier 210.

The first feedback resistor 212 is coupled between the drain of the N-channel transistor 226 and the drain of the N-channel transistor 236.

The third differential amplifier 210 includes an N-channel transistor 242 having a drain coupled to a drain of a P-channel transistor 244 and a gate coupled to receive the output signal from the first differential amplifier 204. The gate of the N-channel transistor 242 is a non-inverting input of the third differential amplifier 210. An N-channel transistor 246 has a drain coupled to a drain of a P-channel transistor 248 and a gate coupled to receive the output signal of the second differential amplifier 208. The gate of the N-channel transistor 246 is an inverting input of the third differential amplifier 210. An output signal from the third differential amplifier 210 is generated at the drain of the N-channel transistor 246. Sources of the P-channel transistors 244 and 248 are coupled to the positive voltage supply Vcc. The P-channel transistors 244 and 248 are a load network to modulate a voltage swing of the third differential amplifier 210. Sources of the N-channel transistors 242 and 246 are coupled to a drain of an N-channel transistor 250, and a source of the N-channel transistor 250 is coupled to a reference voltage (e.g., ground voltage). A gate of the N-channel transistor 250 is coupled to gates of the P-channel transistors 244 and 248 and to the drain of the N-channel transistor 242 to self-bias the third differential amplifier 210.

The first inverter 214 includes a P-Channel transistor 262 having a source coupled to the positive voltage supply Vcc and a drain coupled to a drain of an N-channel transistor 264. A source of the N-channel transistor 264 is coupled to a reference voltage (e.g., ground voltage). Gates of the P-channel transistor 262 and the N-channel transistor 264 are coupled to the drain of the N-channel transistor 246 to receive the output signal from the third differential amplifier 210, and this output signal is inverted at the drain of the N-channel transistor 264.

The second inverter 216 includes a P-Channel transistor 272 having a source coupled to the positive voltage supply Vcc and a drain coupled to a drain of an N-channel transistor 274. A source of the N-channel transistor 274 is coupled to a reference voltage (e.g., ground voltage). Gates of the P-channel transistor 272 and the N-channel transistor 274 are coupled to the drain of the N-channel transistor 264 to receive the inverted output signal from the first inverter 214 and this inverted output signal is inverted again at the drain of the N-channel transistor 274 to generate the output signal OUT on the output terminal 218.

Each of the differential amplifiers 204, 208 and 210 shown in FIG. 2 may be an N-type, a P-type or a fully complementary differential amplifier according to various embodiments.

Figure 3:
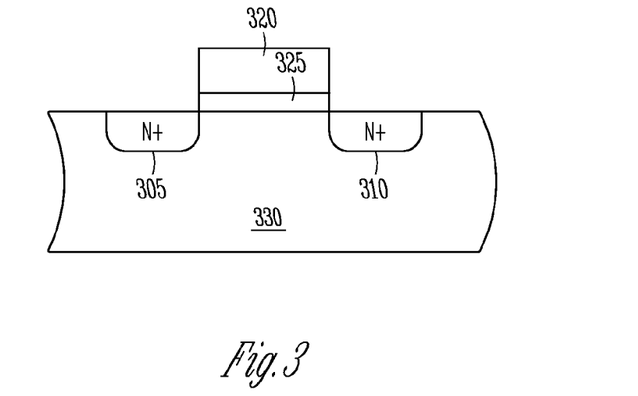
FIG. 3 is a cross-sectional view of an n-channel field effect transistor according to various embodiments.

The first feedback resistor 212 may be replaced by a transistor in a resistor-like configuration. FIG. 3 is a cross-sectional view of an n-channel field effect transistor (FET) 300 according to various embodiments. The FET 300 includes a source 305, a drain 310, and a gate 320. A gate insulator 325 is interposed between the gate 320 and a substrate 330. Current may flow between the source 305 and the drain 310 when the FET 300 is rendered conductive by a control gate voltage on the gate 320 that is separated from a voltage of the source 305 by a threshold voltage. A resistance of the FET 300 between the source 305 and the drain 310 is determined by the magnitude of the control gate voltage.

With reference to FIG. 2, the first feedback resistor 212 may be replaced by the FET 300. The drain 310 may be coupled to the drain of the N-channel transistor 226 and the source 305 may be coupled to the drain of the N-channel transistor 236. The FET 300 may be switched on to provide a resistance between the first differential amplifier 204 and the second differential amplifier 208 that is controlled by the control gate voltage.

Figure 4:
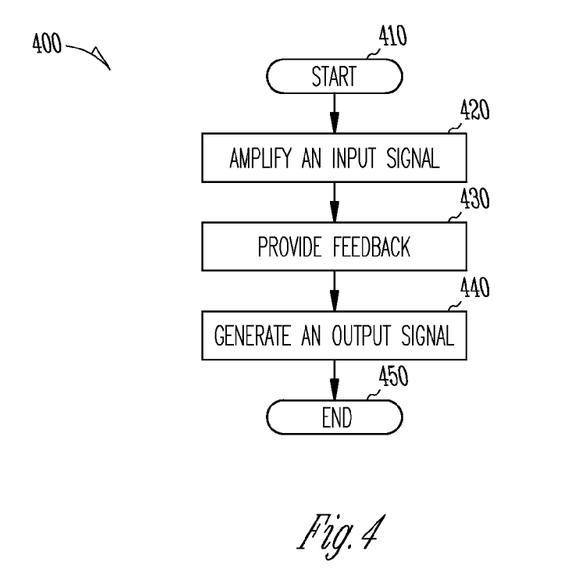
FIG. 4 is a flow diagram of a method according to various embodiments.

FIG. 4 is a flow diagram of a method 400 according to various embodiments. In block 410, the method 400 starts. In block 420, an input signal is amplified in a first differential amplifier to generate a first output signal. The input signal is also amplified in a second differential amplifier to generate a second output signal that is complementary to the first output signal. The input signal may be a single-ended input signal provided to a non-inverting input of the first differential amplifier and an inverting input of the second differential amplifier. A reference voltage is provided to an inverting input of the first differential amplifier and a non-inverting input of the second differential amplifier to indicate a transition of the input signal from a logic high to a logic low. The input signal may also be a differential signal including a non-inverted signal and an inverted signal. The inverted signal is provided to the non-inverting input of the first differential amplifier and the inverting input of the second differential amplifier. The non-inverted signal is provided to the inverting input of the first differential amplifier and the non-inverting input of the second differential amplifier.

In block 430, feedback is provided with a first resistance coupled between the first output signal and the second output signal. The first resistance may be modulated by controlling a transistor. In block 440, a third output signal is generated by amplifying the first output signal and the second output signal in a third differential amplifier. The third output signal is amplified in an inverter to generate an amplified third output signal and feedback is provided with a second resistance coupled in parallel with the inverter. In block 450, the method 400 ends. Various embodiments may have more or fewer activities than those shown in FIG. 4. In some embodiments, the activities may be repeated, and/or performed in serial or parallel fashion. Some embodiments may comprise the same activities in a different order.

Figure 5:
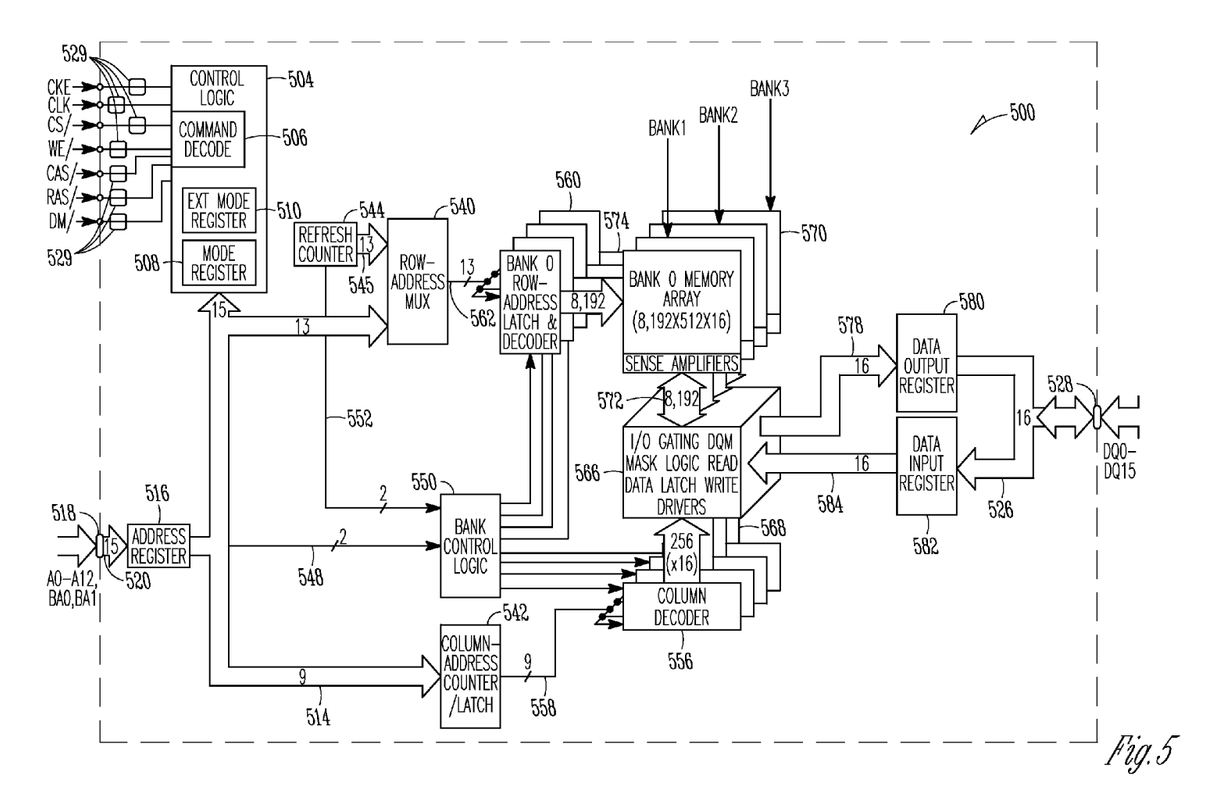
FIG. 5 is a block diagram of an apparatus in the form of a memory device according to various embodiments.

FIG. 5 is a block diagram of an apparatus in the form of a memory device 500 according to various embodiments. The memory device 500 includes a control logic circuit 504 coupled to receive external command signals from a memory control circuit (not shown).

The external command signals include a clock enable signal CKE and a clock signal CLK. The clock enable signal CKE is a signal indicating validity of the following clock signal CLK. The external command signals also include a chip select signal CS/, a write enable signal WE/, a column address strobe signal CAS/, a row address strobe signal RAS/, and a data-mask signal DM/. The "/" designation indicates that the signal is active low. The external command signals are decoded in a command decode circuit 506.

The memory device 500 has one or more mode registers 508 and extended mode registers 510 that are programmed with information for operating the memory device 500. The memory device 500 also includes an address bus 514 that receives address bits A0-A12, BA0, and BA1 from an address register 516. The address register 516 receives the address bits A0-A12, BA0, and BA1 from a source external to the memory device 500 through a port 518 and a bus 520. The memory device 500 also includes a data bus 526 that receives and transmits data bits DQ0-DQ15 through a port 528.

Each of the signals CKE, CLK, CS/, WE/, CAS/, RAS/ and DM/ is received by the memory device 500 through a separate input buffer system 529. Each of the address bits A0-A12, BA0, and BA1 is received by the memory device 500 through a separate input buffer system in the port 518 (input buffer systems not shown). Each of the data bits DQ0-DQ15 is received by the memory device 500 through a separate input buffer system in the port 528 (input buffer systems not shown). Each of the input buffer systems 529 and the input buffer systems in the ports 518 and 528 may be the input buffer system 100 shown in FIG. 1 or the input buffer system 200 shown in FIG. 2 according to various embodiments.

The chip select signal CS/ is a signal used to select one device, such as the memory device 500, out of several devices connected to the same bus. A low CS/ signal enables the command decode circuit 506 in the memory device 500, and a high CS/ signal disables the command decode circuit 506. All commands are masked from the memory device 500 when the CS/ signal is high, but READ/WRITE bursts already in progress will continue to completion, and a data mask (DQM) operation will retain its DQ mask capability while the CS/ signal is high. Thus, the low CS/ signal enables a device connected to a bus to respond to commands and data on the bus while the high CS/ signal tells the device to ignore the bus. The CS/ signal provides for external bank selection on systems with multiple banks.

The address bits A0-A12, BA0, and BA1 are captured on a falling edge of the row address strobe signal RAS/, and a row of memory cells in an array of memory cells corresponding to the address is opened. The row is held open as long as the row address strobe signal RAS/ is low. Address inputs are captured on a falling edge of the column address strobe signal CAS/, and a column of the memory cells in the array of memory cells corresponding to the captured address is selected from the currently open row for a read or write operation.

The write enable signal WE/ determines whether a given falling edge of the column address strobe signal CAS/ initiates a read or a write operation. A high write enable signal WE/ directs a read operation, while a low write enable signal WE/ directs a write operation. If the write enable signal WE/ is low, data is captured at inputs on the falling edge of the column address strobe signal CAS/. The signals WE/, CAS/, RAS/, and CS/ can, in various combinations, represent other commands not described above.

The data-mask signal DM/ controls input over the data bus 526 during write operations. The data bus 526 is activated to carry data to the memory device 500 if the data-mask signal DM/ is low, and data on the data bus 526 is masked from the memory device 500 if the data-mask signal DM/ is high.

Management of read and write operations is performed by the control logic circuit 504 upon receiving the external command signals. The mode registers 508 and the extended mode registers 510 have operating information that is programmed by a memory controller (not shown) on initialization or boot-up of the memory device 500. According to some embodiments, the memory device 500 comprises a dynamic random access memory (DRAM) device or a synchronous dynamic random access memory (SDRAM) device.

The memory device 500 can be formed on a semiconductor die using a substrate, where the substrate is a material such as silicon, germanium, silicon on sapphire, gallium arsenide, or other semiconductor material. The elements of the memory device 500 are fabricated using conventional processing, well-known to those of ordinary skill in the art, to form the various circuits within the semiconductor material and for providing electrical connections for coupling to an address bus, a data bus, and control lines for communication with a controller or a processor.

The address bits A0-A12, BA0, and BA1 are coupled from the address bus 514 to the mode register 508 and the extended mode register 510 in the control logic circuit 504, a row address multiplexer 540, and a column address counter/latch 542. A refresh counter circuit 544 generates address bits that are coupled on a bus 545 to the row address multiplexer 540. The row address multiplexer 540 and the column address counter/latch 542 hold the address bits A0-A12, BA0, and BA1. Two address lines 548 from the address bus 514 are coupled to a bank control logic circuit 550, and two address lines 552 are coupled from the refresh counter circuit 544 to the bank control logic circuit 550. The bank control logic circuit 550 stores address bits to be used to select a bank of memory cells. Address bits in the column address counter/latch 542 are coupled to a plurality of column decoder circuits 556 over a plurality of lines 558. Similarly, address bits in the row address multiplexer 540 are coupled to bank row address latch and decoder circuits 560 over a plurality of lines 562.

The column decoder circuits 556 decode the address bits from the column address counter/latch 542 and couple the decoded signals to a plurality of circuits 566 including an input/output (I/O) gating circuit, a DQM mask logic circuit, read data latch circuits, and write driver circuits over a plurality of lines 568. The circuits 566 select columns of memory cells in a bank of memory arrays 570 through a plurality of lines 572. The bank row address latch and decoder circuits 560 select rows of memory cells in the bank of memory arrays 570 through a plurality of lines 574. A data bit is written to or read from a selected memory cell in the bank of memory arrays 570 located in a column selected by the circuits 566 and a row selected by the bank row address latch and decoder circuit 560. The refresh counter circuit 544 generates refresh address bits to periodically refresh the memory cells in the bank of memory arrays 570, the refresh address bits being coupled to the row address multiplexer 540 through the bus 545 and to the bank control logic circuit 550 through the lines 552. The address bits received by the bank control logic circuit 550 on the lines 548 or 552 select one of the bank row address latch and decoder circuits 560 and one of the column decoder circuits 556 that, in turn, select a memory cell in the bank of memory arrays 570.

Data bits read from the memory cells in the bank of memory arrays 570 are coupled through the circuits 566 and a bus 578 to a data output register 580 where the data bits are stored. Data bits stored in the data output register 580 are then coupled to the bus 526 and transmitted through the port 528. Similarly, data bits to be written to the memory cells in the bank of memory arrays 570 are received from the bus 526 through a data input register 582, where the data bits are stored temporarily, before being coupled over a bus 584 to the circuits 566 from which the data bits are written to memory cells in the bank of memory arrays 570.

Figure 6:
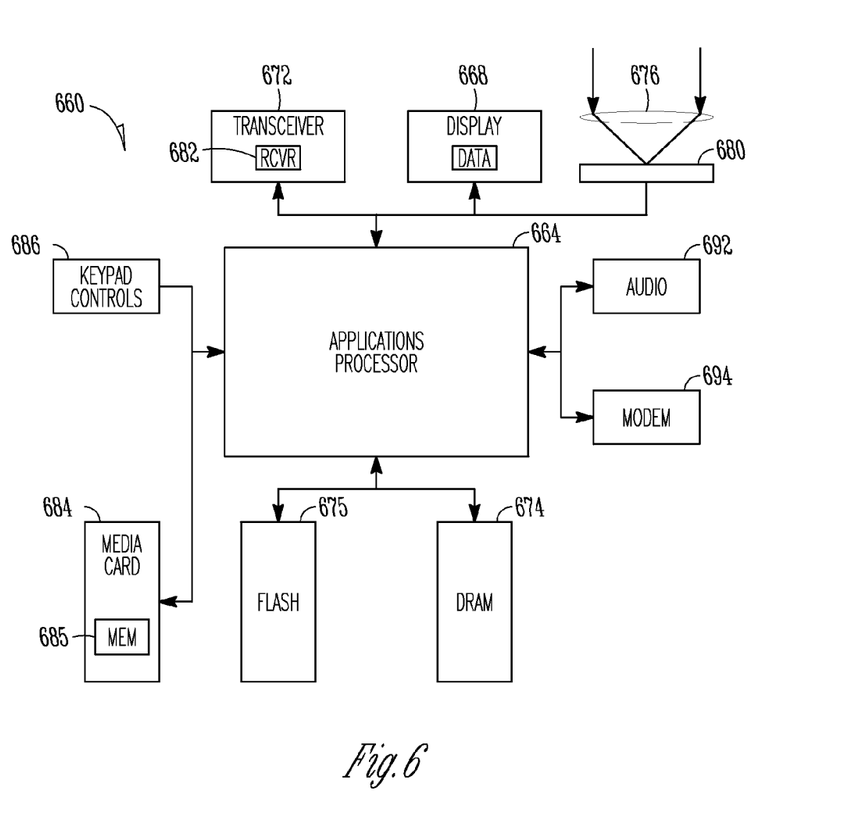
FIG. 6 is a block diagram of an apparatus in the form of a system according to various embodiments.

FIG. 6 is a block diagram of an apparatus in the form of a system 660 according to various embodiments. The system 660, in some embodiments, may include a processor 664 coupled to a display 668 and/or a wireless transceiver 672. The display 668 may be used to display data, perhaps received by the wireless transceiver 672. The system 660, in some embodiments, may include a memory device such as a DRAM 674 and/or a Flash memory 675. The processor 664 is coupled to exchange data with the DRAM 674 and the Flash memory 675. The DRAM 674 may be a SDRAM.

In some embodiments, the system 660 may include a camera including a lens 676 and an imaging plane 680 to couple to the processor 664. The imaging plane 680 may be used to receive light captured by the lens 676.

Many variations are possible. For example, in some embodiments, the system 660 may include a cellular telephone receiver 682 forming a portion of the wireless transceiver 672. The cellular telephone receiver 682 may also receive data to be processed by the processor 664, and displayed on the display 668. In some embodiments, the system 660 may include an audio, video, or multi-media player 684, including a memory device 685 and a set of media playback controls 686 to couple to the processor 664. The processor 664 may also be coupled to exchange data with an audio device 692 and/or a modem 694.

The processor 664, the DRAM 674, the Flash memory 675, the memory device 685 or any of the other electronic components of the system 660 may include the input buffer system 100 shown in FIG. 1 or the input buffer system 200 shown in FIG. 2, according to various embodiments.

The circuits and methods described herein employ a shunt resistance to modulate a voltage swing and improve a frequency response of an input buffer system. The shunt resistance also provides feedback to reduce variance in performance caused by changes in process, voltage or temperature (PVT). This can lead to a significant performance improvement over conventional technology.

Example structures and methods of input buffer systems have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising:
   a first circuit to amplify an input signal into a first output signal;
   a second circuit to amplify the input signal into a second output signal that is complementary to the first output signal;
   a feedback resistance coupled between the first output signal and the second output signal and configured to limit a voltage swing between the first circuit and the second circuit; and
   a third circuit to combine the first output signal with the second output signal to generate a third output signal.

2. The apparatus of claim 1, wherein:
   the first circuit comprises a self-biased differential amplifier; and
   the second circuit comprises a self-biased differential amplifier.

3. The apparatus of claim 2, wherein the third circuit comprises a self-biased differential amplifier.

4. The apparatus of claim 1, further comprising an inverter coupled to the third circuit to amplify the third output signal.

5. A method comprising:
   amplifying an input signal into a first output signal;
   amplifying the input signal into a second output signal that is complementary to the first output signal;
   providing feedback with a resistance coupled between the first output signal and the second output signal to limit a voltage swing between the first output signal and the second output signal; and
   combining the first output signal with the second output signal to generate a third output signal.

6. The method of claim 5, wherein amplifying the input signal further comprises amplifying a single-ended input signal.

7. The method of claim 5, wherein amplifying the input signal further comprises amplifying a differential input signal.

8. The method of claim 7, wherein combining the first output signal with the second output signal further comprises amplifying the first output signal and the second output signal.

9. An apparatus comprising:
   a first differential amplifier to amplify an input signal into a first output signal;
   a second differential amplifier to amplify the input signal into a second output signal that is complementary to the first output signal;
   a first feedback resistance coupled between the first output signal and the second output signal and configured to limit a voltage swing between the first differential amplifier and the second differential amplifier; and
   a third differential amplifier to combine the first output signal with the second output signal to generate a third output signal.

10. The apparatus of claim 9, wherein the first feedback resistance comprises a resistor.

11. The apparatus of claim 9, wherein the first feedback resistance comprises a transistor.

12. The apparatus of claim 9, further comprising an inverter coupled to the third differential amplifier and coupled in parallel with a second feedback resistance to amplify the third output signal.

13. The apparatus of claim 9, wherein the apparatus comprises an input buffer.

14. The apparatus of claim 9, wherein the apparatus comprises an input buffer in a memory device to amplify the input signal provided to the memory device and to provide the third output signal to the memory device.

15. A method comprising:
amplifying an input signal in a first differential amplifier to generate a first output signal;
amplifying the input signal in a second differential amplifier to generate a second output signal that is complementary to the first output signal;
limiting a voltage swing between the first output signal and the second output signal with a first resistance; and
amplifying the first output signal and the second output signal in a third differential amplifier to generate a third output signal.

16. The method of claim 15, further comprising providing the input signal to a non-inverting input of the first differential amplifier and to an inverting input of the second differential amplifier.

17. The method of claim 16, further comprising providing a reference voltage to an inverting input of the first differential amplifier and to a non-inverting input of the second differential amplifier to indicate a transition of the input signal from a logic high to a logic low.

18. The method of claim 15, wherein:
the input signal comprises a differential signal comprising an inverted signal and a non-inverted signal; and
further comprising:
providing the inverted signal to a non-inverting input of the first differential amplifier and to an inverting input of the second differential amplifier; and
providing the non-inverted signal to an inverting input of the first differential amplifier and a non-inverting input of the second differential amplifier.

19. The method of claim 15, wherein providing feedback with the first resistance further comprises controlling a transistor coupled between the first output signal and the second output signal to modulate the first resistance.

20. The method of claim 15, further comprising:
amplifying the third output signal in an inverter to generate an amplified third output signal; and
providing feedback with a second resistance coupled in parallel with the inverter.

21. The method of claim 15, wherein amplifying the input signal further comprises receiving the input signal in a memory device from a bus coupled to the memory device in a system including the memory device, the bus and a processor.

22. The method of claim 21, wherein receiving the input signal comprises receiving one of an address signal;
a data signal;
a chip select signal;
a clock signal;
a clock enable signal to indicate a validity of the clock signal;
a row address strobe signal to capture an address input and open a row in an array in the memory device corresponding to the address input;
a column address strobe signal to capture an address input and select a column in the array corresponding to the address input;
a write enable signal to determine whether the column address strobe signal initiates a read operation or a write operation; and
a data-mask signal to control data input and data output between the memory device and a data bus.

* * * * *